United States Patent
Samuelson et al.

(10) Patent No.: US 8,692,301 B2
(45) Date of Patent: Apr. 8, 2014

(54) NANOSTRUCTURED PHOTODIODE

(75) Inventors: Lars Samuelson, Malmö (SE); Federico Capasso, Cambridge, MA (US); Jonas Ohlsson, Malmö (SE)

(73) Assignee: QuNano AB, Lund (SE)

( * ) Notice: Subject to any disclaimer, the term of this patent is extended or adjusted under 35 U.S.C. 154(b) by 618 days.

(21) Appl. No.: 13/062,018

(22) PCT Filed: Sep. 4, 2009

(86) PCT No.: PCT/SE2009/050997
§ 371 (c)(1),
(2), (4) Date: Mar. 3, 2011

(87) PCT Pub. No.: WO2010/027322
PCT Pub. Date: Mar. 11, 2010

(65) Prior Publication Data
US 2011/0180894 A1   Jul. 28, 2011

(30) Foreign Application Priority Data

Sep. 4, 2008 (SE) ........................ 0801906
Apr. 15, 2009 (SE) ........................ 0900498

(51) Int. Cl.
H01L 33/00 (2010.01)
H01L 31/062 (2012.01)
H01L 31/113 (2006.01)

(52) U.S. Cl.
USPC .......................................... 257/290; 257/82

(58) Field of Classification Search
USPC ....... 257/79–82, 290–294, E33.005, E33.077
See application file for complete search history.

(56) References Cited

U.S. PATENT DOCUMENTS

| 8,299,472 B2 * | 10/2012 | Yu et al. ........................ 257/72 |
| 2008/0156366 A1 | 7/2008 | Kim et al. |
| 2011/0079796 A1 * | 4/2011 | Wober ........................... 257/82 |

FOREIGN PATENT DOCUMENTS

| EP | 1703569 A2 | 9/2006 |
| EP | 1748494 A1 | 1/2007 |
| WO | 2008/079077 A2 | 7/2008 |

OTHER PUBLICATIONS

International Searching Authority—Swedish Patent Office (ISA/SE). International Search Report, Intl. Application PCT/SE09/050997. Dec. 1, 2009.
Lu, Y., et al. ZnO nanorod arrays as p-n heterojunction ultraviolet photodetectors. Electronics Letters, vol. 42 No. 22, pp. 1309-1310 (Oct. 26, 2006).

* cited by examiner

*Primary Examiner* — Cuong Q Nguyen
(74) *Attorney, Agent, or Firm* — The Marbury Law Group PLLC

(57) ABSTRACT

The present invention provides a photodiode comprising a p-i-n or pn junction at least partly formed by first and second regions (2) made of semiconductor materials having opposite conductivity type, wherein the p-i-n or pn junction comprises a light absorption region (11) for generation of charge carriers from absorbed light. One section of the p-i-n or pn junction is comprises by one or more nanowires (7) that are spaced apart and arranged to collect charge carriers generated in the light absorption region (11). At least one low doped region (10) made of a low doped or intrinsic semiconductor material provided between the nanowires (7) and one of said first region (1) and said second region (2) enables custom made light absorption region and/or avalanche multiplication region of the active region (9).

21 Claims, 3 Drawing Sheets

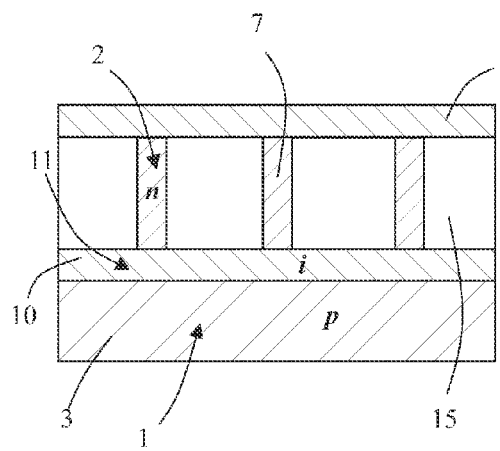
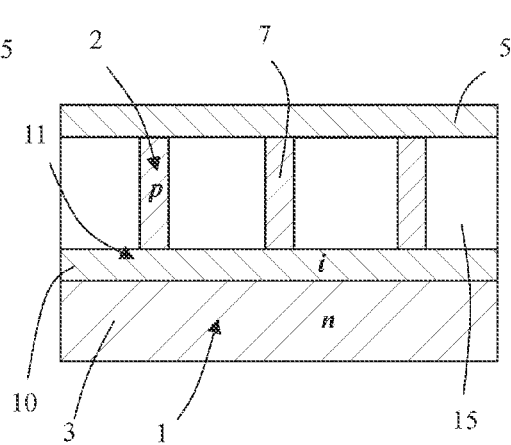
Fig. 1a  Fig. 1b
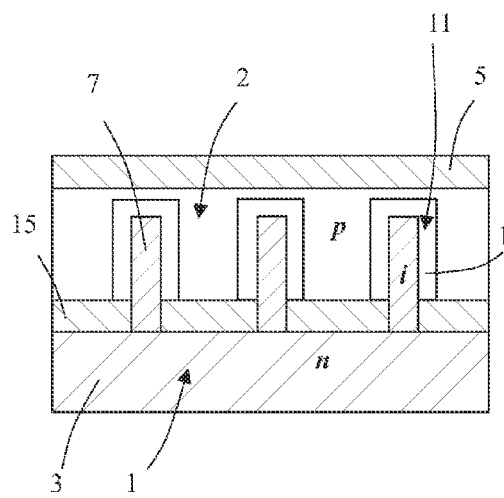
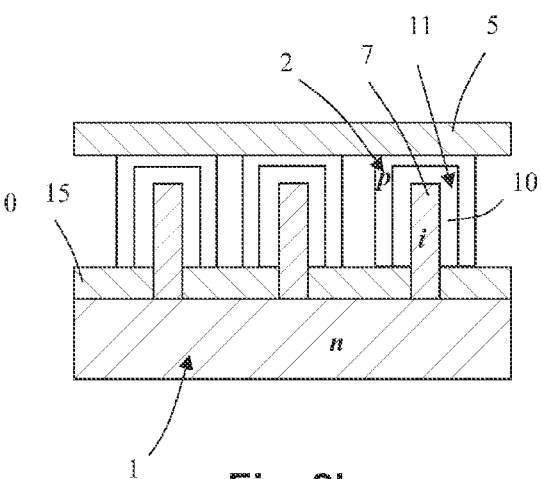
Fig. 2a  Fig. 2b

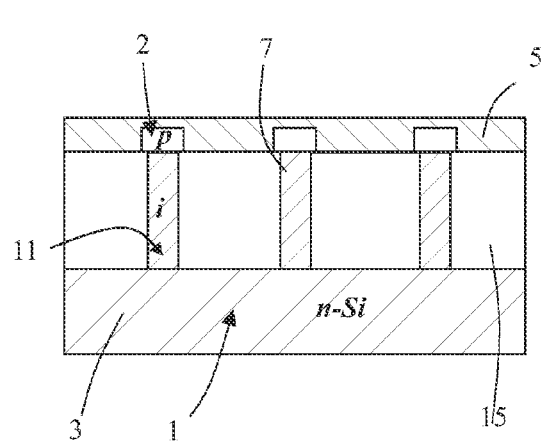
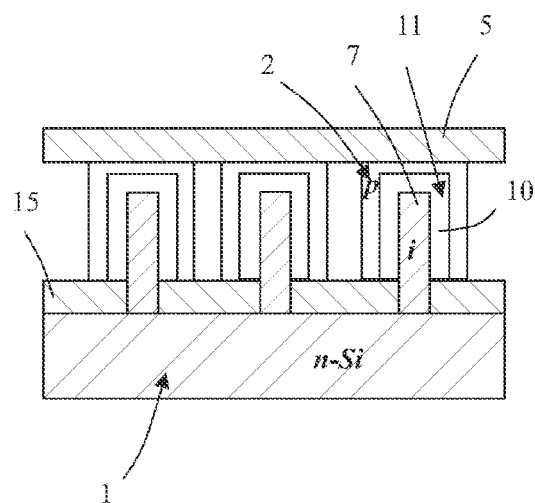
Fig. 3a          Fig. 3b
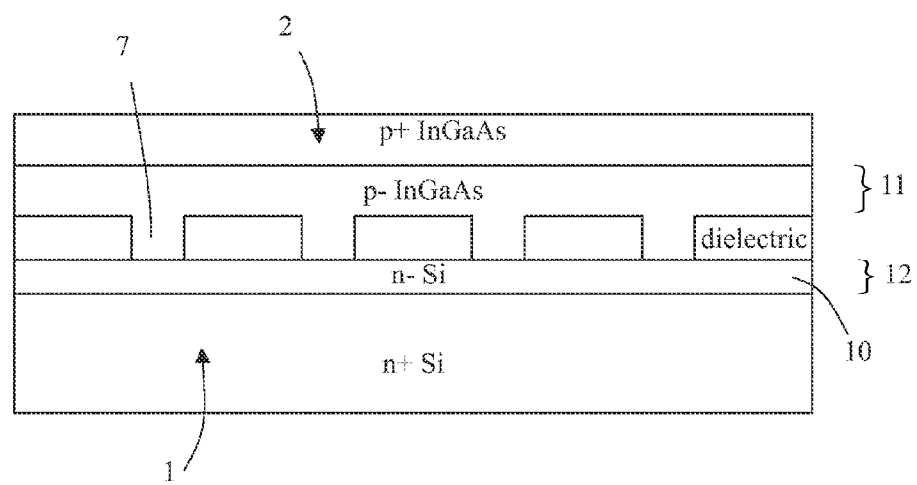
Fig. 4
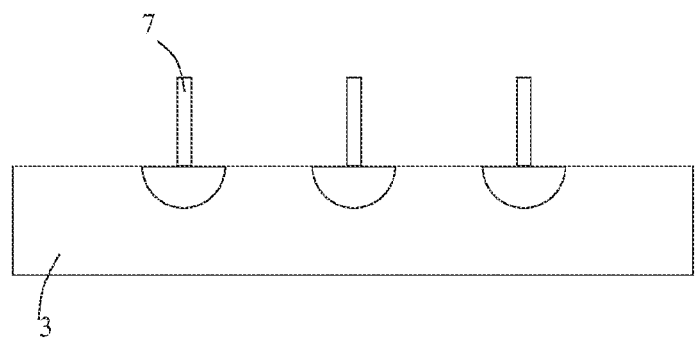
Fig. 7

NANOSTRUCTURED PHOTODIODE

CROSS-REFERENCE TO OTHER APPLICATIONS

This application is a national phase application under 35 U.S.C. §371 of international application PCT/SE2009/050997 (filed Sep. 4, 2009), which claims priority to Swedish Application 0801906-9 (filed Sep. 4, 2008) and Swedish Application 0900498-7 (filed Apr. 15, 2009). All of these prior applications are hereby incorporated by reference in their entirety.

TECHNICAL FIELD OF THE INVENTION

The present invention relates to photodiodes and avalanche photodiodes that includes nanowires as part of the pn or pin junction.

BACKGROUND OF THE INVENTION

A photodiode (PD) is a type of photodetector that is capable of generating charge carriers when exposed to light or other electromagnetic energy. An avalanche photodiode (APD) is another type of photodetector device that further to the charge carrier generation includes a multiplication of the charge carriers, i.e. an internal current gain effect, which enables a high sensitivity. Hereinafter PDs and APDs are commonly simply referred to as photodiodes when features common for both types of photodetectors are discussed.

Semiconductor photodiodes fabricated using conventional planar technology comprise a vertical pn junction, i.e. a p-type semiconductor layer on an n-type semiconductor layer, or a vertical p-i-n junction, i.e. with one or more intermediate intrinsic or low doped semiconductor layers in-between the p-type and n-type layers, in-between two electrical contacts. The avalanche photodiode performs amplification of a photocurrent generated from absorbed light by applying a reverse bias voltage to its p-i-n junction to cause an avalanche multiplication under a high electric field. It is well known that the performance of semiconductor photodiodes is limited by high dark current and noise. Typically different parts of the p-i-n or pn junction of APDs are formed of different materials in order to improve the performance of e.g. the light absorption region and the avalanche multiplication region. For example Si provides low noise characteristics but limits the detectable wavelength. However, one significant contribution to the device leakage current, i.e. the dark current, originates from a fairly high defect density in the device layers. This is predominant when device layers that are non-compatible with respect to e.g. lattice strain are combined, by epitaxial growth or by wafer bonding. Further, APDs suffer from edge breakdown due to the high electrical field. The edge breakdown can partly be avoided by using so called guard rings. However this limits the active area of the device.

The size of sensitive photodetector structures is currently limited due to a disproportionate increase in dark current with an increase in surface area. In addition, the dark current tends to increase over time due to degradation of the semiconductor material. Eventually, the device fails due to short-circuiting. This effect is particularly prominent in high internal electric field devices such as APDs since high current levels will accelerate the degradation.

SUMMARY OF THE INVENTION

The prior art large area photodetectors have drawbacks with regards to high dark current, limited sensitivity, scalability and limited reliability due to short circuiting. An object of the present invention is to provide a photodiode that may at least partly overcome the drawbacks of the prior art.

The photodiode according to the invention comprises a p-i-n or pn junction at least partly formed by a first region made of a semiconductor material having a first conductivity type and a second region made of a semiconductor material having a second conductivity type opposite to the first conductivity type arranged in-between two contacts. The p-i-n or pn junction comprises a light absorption region for generation of charge carriers from absorbed light. One section of the p-i-n or pn junction comprises one or more nanowires that are spaced apart and arranged to collect the charge carriers from the light absorption region. Preferably the nanowires protrude from a semiconductor substrate or a surface layer arranged on the semiconductor substrate and the semiconductor substrate or the surface layer comprises said first region.

At least one low doped region made of a low doped or intrinsic semiconductor material that is provided between the nanowires and one of said first region and said second region enables an improved design and performance of photodiodes and avalanche photodiodes.

In one aspect of the invention an axial photodiode design is provided, wherein said first region of the first conductivity type is a doped region in the semiconductor substrate or the surface layer and the low doped region is provided between said first region and the nanowires.

In another aspect of the invention a radial photodiode design is provided, wherein the low doped region and optionally a doped region is arranged on each nanowire in a core-shell configuration.

The photodiode is not limited to these axial and radial designs. One or more low doped regions can be provided on both sides of the nanowires, and a planar layer on one side of the nanowires can be combined with a radial layer on the other side of the nanowires.

In an avalanche photodiode according to one embodiment of the present invention a p-i-n junction is partly formed by a low doped region made of a low doped or intrinsic semiconductor material arranged on a doped region of the first conductivity type in a semiconductor substrate or a surface layer arranged on the semiconductor substrate. The low doped region comprises an avalanche multiplication region and optionally a light absorption region. Another part of the p-i-n junction is formed by one or more nanowires protruding from the low doped region. The nanowires may be doped to provide a second region of a second conductivity type opposite to the first conductivity type or the nanowires may be connected to an adjacent doped layer that together with the nanowires or by itself provides said second region.

In another embodiment of an avalanche photodiode according to the present invention a p-i-n junction is formed by a first low doped layer made of a low doped or intrinsic semiconductor material of second conductivity type arranged on a first doped layer of the first conductivity type in a semiconductor substrate or a surface layer, nanowires protruding through openings in a dielectric layer to a second low doped layer of a low doped or intrinsic semiconductor material of the second conductivity type opposite to the first conductivity type, and a second doped layer of the second conductivity type arranged on the second low doped layer. A light absorption region is provided by the second low doped layer and an avalanche multiplication region is provided by the first low doped layer. Charge carriers generated from light absorbed in the second low doped layer are collected by the nanowires and transported to the first low doped layer due to a reverse bias.

Many of the limitations in the commonly used planar technology can be derived from challenges in limited flexibility in material combinations, mainly due to lattice match restrictions. The possibility of direct growth of e.g. III-V nanowires on silicon for fabrication of photodiodes according to the invention implies strong advantages as compared to commonly used wafer-bonding techniques.

Thanks to the invention it is possible to provide photodiodes that have improved dark current properties. It is a further advantage of the invention to provide photodiodes that have a substantially constant dark current over time, thereby significantly reducing the risk for failure due to short circuiting. Instead the nanowires of the photodiodes according to the invention may be designed to provide a circuit breaker behavior.

The performance and reliability of photodiodes according to the invention can be further improved by utilizing at least a portion of the nanowires as a current limiting structure based on space charge build-up in the nanowire portion. This space charge effect yields a surprisingly high, and designable, series resistance which makes it possible to prevent excessive current leakage and device failure. Reverse resistance of the photodiode may also be increased to enable photodiodes with higher breakdown voltage and improved avalanche functionality.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein:

FIGS. 1a-b schematically illustrate photodiodes wherein the active region is located in a common intrinsic layer in-between doped nanowires and a doped substrate in accordance with the invention;

FIGS. 2a-b schematically illustrate photodiodes comprising nanowires protruding from a doped substrate that forms one region of the p-i-n junction wherein the active region is located in intrinsic layers enclosing each nanowire, in FIG. 2a the other doped region of the p-i-n junction is formed by a common coalesced semiconductor layer re-grown from nanowires, and in FIG. 2b each nanowire is enclosed in a separate doped semiconductor layer in accordance with the invention;

FIG. 3 schematically illustrate in (a) one embodiment of an axial photodiode design and in (b) a radial photodiode design based on InGaAs nanowires grown on silicon in accordance with the invention;

FIG. 4 schematically illustrates a photodiode comprising two low doped layers separated by nanowires in accordance with the invention;

FIG. 7 schematically illustrates a junction profile under the nanowires in accordance with the invention.

DETAILED DESCRIPTION OF EMBODIMENTS

Figure 5:
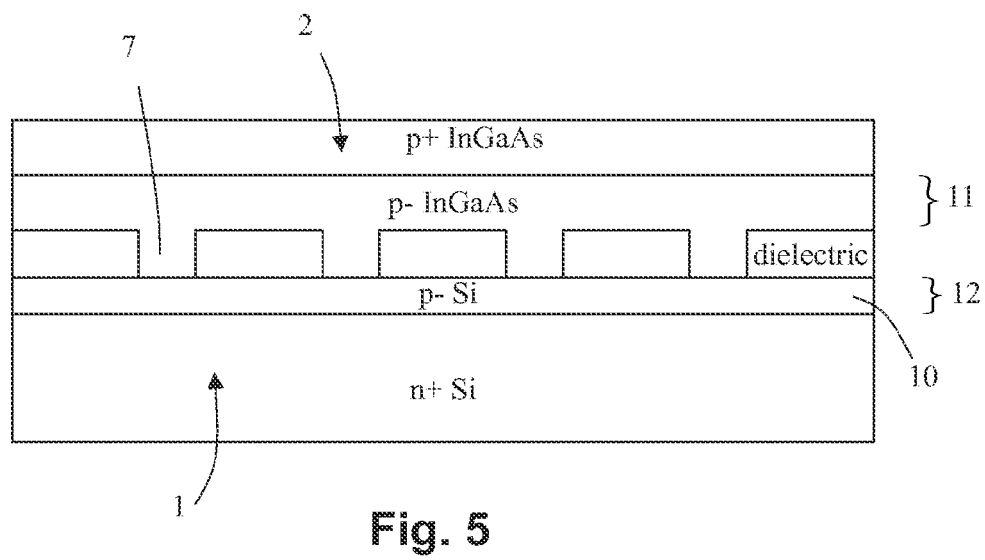
FIG. 5 schematically illustrates an InGaAs/Si SAM APD in accordance with the invention.

In the present invention one section of a semiconductor photodiode is partitioned by using a nanowire array comprising typically 1 to more than 10 exp 8) nanowires spaced apart from each other. Basically, the nanowires of the nanowire array connect the p and n regions of the photodiode to each other, whereby charge carriers, which are generated from absorbed light in a light absorption region, are due to a bias collected by the nanowires and efficiently conducted away. This can be used for different photodetectors and is in the following particular described for photodiodes (PD), avalanche photodiodes (APD), and separate absorption-multiplication avalanche photodiode (SAM APD).

For the purpose of this application the term nanowire is to be interpreted as a structure being essentially of nanometer dimensions in its width or diameter. Such structures are commonly also referred to as nanowhiskers, nanorods, etc. The basic process of nanowire formation on substrates by particle assisted growth or the so-called VLS (vapour-liquid-solid) mechanism described in U.S. Pat. No. 7,335,908, as well as different types of Chemical Beam Epitaxy and Vapour Phase Epitaxy methods, which are well known. However, the present invention is limited to neither such nanowires nor the VLS process. Other suitable methods for growing nanowires are known in the art and is for example shown in international application No. WO 2007/104781. From this it follows that nanowires may be grown without the use of a particle as a catalyst. Thus selectively grown nanowires and nanostructures, etched structures, other nanowires, and structures fabricated from nanowires are also included.

While there are certain limitations in semiconductor devices fabricated using planar technology, such as lattice mismatch between successive layers, nanowire technology provides greater flexibility in selection of semiconductor materials in successive layers and hence greater possibility to tailor the band structure. One example is growth of III-V semiconductor nanowires on Si substrates, which is utilized for embodiments of the invention that are described in the following. Nanowires potentially also have a lower defect density than planar layers and by replacing at least portions of planar layers in semiconductor devices with nanowires, limitations with regards to defects can be diminished. Further, nanowires provide surfaces with low defect densities as templates for further epitaxial growth.

Referring to FIGS. 1-4, in detail a photodiode according to the present invention comprises a p-i-n or pn junction at least partly formed by a first region 1 made of a semiconductor material having a first conductivity type and a second region 2 made of a semiconductor material having a second conductivity type opposite to the first conductivity type, i.e. the first region is p-type and the second region is n-type or the first region is n-type and the second region is p-type. The p-i-n or pn junction further comprises a light absorption region 11 for generation of charge carriers from absorbed light. One section of the p-i-n or pn junction comprises an array of nanowires 7 that are spaced apart and arranged to collect the charge carriers from the light absorption region 11. A gap between the nanowires may be filled with a dielectric material, an intrinsic semiconductor material or a low doped semiconductor material. This material may be transparent.

Nanowires are typically grown on a semiconductor substrate or a surface layer arranged on the semiconductor substrate. The semiconductor substrate and/or the surface layer is preferably part of the photodiode according to the invention. The nanowires 7 of the photodiode then protrudes from a semiconductor substrate 3 or a surface layer 4 arranged on the semiconductor substrate 3 and the semiconductor substrate 3 or the surface layer 4 comprises said first region 1.

As indicated above the photodiode may comprise a pn junction with semiconductor materials of opposite conductivity type on each side of a junction. Charge carriers generated due to absorption of incoming light are separated by the junction and contribute to a photocurrent. The absorption takes place in a depletion region or in immediate vicinity thereof. The properties, such as the width, of the depletion region can be changed by introducing a low doped region made of a low doped or intrinsic semiconductor material in-between the p-type and n-type region, preferably adjacent to the nanowires, thereby forming a p-i-n junction. Inherently the low doped region of the p-i-n junction enables a wider depletion region than in the pn junction. The depletion region, and hence the light absorption region, may be fully within the low doped region or it may extend into any adjacent region such as the nanowires and/or the p or n region. The major use of nanowires in this invention is not to be light absorbers, although at least a part thereof can be used as such. Consequently, the light absorbing region may overlap with the nanowires 7.

In one embodiment of the present invention at least a first low doped region 10 made of a low doped or intrinsic semiconductor material is provided between the nanowires 7 and one of said first region 1 and said second region 2 of opposite conductivity type in order to at least partly form the light absorption region 11 of a p-i-n junction. Low doped regions 10 can be provided on any or both sides of the nanowires 7. For the purpose of this application a low doped region 10 arranged in the semiconductor substrate or a surface layer arranged on the semiconductor substrate is referred to as an axial design and a low doped region 10 arranged as a shell layer that at least partly encloses each nanowire 7 is referred to as a radial design. However, the invention is not limited to pure axial or radial designs. For example, different shell layers may be combined with low doped regions in the semiconductor substrate. The low doped region contributes to the formation of a light absorption region, which is either substantially located adjacent to, or in the semiconductor substrate, in a shell layer surrounding the nanowires or in the layer grown from the nanowires, although the light absorption region 9 may extend into the nanowires 7 and/or said first and second regions 1,2.

Such a low doped region can also be used in the photodiode for the formation of an avalanche multiplication region in the p-i-n junction. The avalanche multiplication and the light absorption may be at least partly formed by the same or different low doped regions. Further the avalanche multiplication region may be at least partly formed by the nanowires.

FIG. 1a schematically illustrates one embodiment of a photodiode according to the present invention comprising a low doped region. The photodiode comprises an array of nanowires 7 protruding from a surface layer 4 arranged on a semiconductor substrate 3. As shown in FIG. 1a, an end portion of each nanowire 7 may be connected to a common first contacting means 5. A p-i-n junction is formed by a first region 1 in the semiconductor substrate 3 made of a p-doped semiconductor material and a second region 2 in each nanowire 7 made of a n-doped semiconductor material with a low doped region 10 in the surface layer 4 made of a low doped or intrinsic material. An light absorption region 11 for generation of charge carriers from absorbed light is substantially provided by the low doped region 10. The generated charge carriers are collected by the nanowires 7 due to a reverse biased p-i-n junction. The light absorption region 11 may be formed by the low doped region 10 itself or the light absorption region 11 may extend into the nanowires 7 and/or the first region 1. FIG. 1b schematically illustrates a photodiode where the first and second regions 1,2 has opposite polarity as compared to the photodiode in FIG. 1a, i.e. the semiconductor substrate 3 is n-type and the nanowires 7 are p-type. The nanowire structures of FIGS. 1a-b can be designed to be operated as photodiodes or avalanche photodiodes. The avalanche photodiode is operated with reverse bias and in addition to the light absorption region the low doped region 10 provides an avalanche multiplication region. A second contacting means (not shown) may be electrically connected to the backside of the semiconductor substrate or elsewhere.

The use of nanowires 7 in the embodiment that is illustrated in FIG. 1 enables a partitioning of the electrical conduction path without the loss of active volume. This partitioned photodiode demonstrate significantly decreased dark current without loss of quantum efficiency, as compared to a corresponding planar device. While being straightforward to fabricate, the partitioned photodiode offers a simple solution to the fundamental problem of high dark current of planar devices.

FIGS. 2a-b schematically illustrates embodiments of a radial design of the photodiode according to the invention. The photodiode comprises an array of nanowires 7 protruding from a semiconductor substrate 3. A p-i-n junction is at least partly formed by a first region 1 made of a semiconductor material having a first conductivity type in the semiconductor substrate and a second region 2 made of a semiconductor material having a second conductivity type opposite to the first conductivity type surrounding each nanowire. A low doped or intrinsic region 10 is provided in-between the array of nanowires 7 and said second region 2 in order to provide alight absorption region for generation of charge carriers. It should be appreciated that the light absorption region of the active region also can be either p type or n type as long as it is doped at a level low enough to be depleted at operating bias. The first and second regions have opposite doping polarity, which in these embodiments is exemplified with an n-doped first region and a p-type second region, however not limited to this. The formation of a radial intrinsic region is an alternative to the planar intrinsic region and the radial approach simplifies the formation of a well defined intrinsic region. Moreover, the radial configuration will enable a large depletion effect, forming a cylindrical depletion region centered around the nanowire and extending out into the surrounding shell layer.

In FIG. 2a, the first region 1 comprises a first n-doped layer of in the semiconductor substrate 3 and at least an end portion of each of the nanowires 7 is enclosed by a shell layer comprising the low doped region 10 overgrown by a second p-doped layer at least partly forming said second region 2. Preferably the nanowires 7 are made of a low doped or intrinsic semiconductor material. The second doped layer comprises a single bandgap or a plurality of bandgaps, greater than the nanowire bandgap. A dielectric layer 15, or alternatively a low doped or intrinsic semiconductor layer, covers the surface of the semiconductor substrate 3 and surrounds the nanowires 7. The p- and n-doped layers and the intermediate intrinsic region and intrinsic nanowire form a p-i-n junction. Charge carriers are photogenerated in a light absorption region 11 substantially corresponding to the low doped region 10 of the shell layer. As illustrate in FIG. 2a the doped layer may be re-grown from the nanowires 7 to form a common coalesced semiconductor layer re-grown from nanowires and filling a gap between the nanowires 7. This facilitates the formation of a common first contact 5 on the doped layer. This photodiode structure gives a high optical density in combination with a wide range of detectable wavelengths while still retaining a low dark current due to the nanowire approach.

In FIG. 2b a gap is left between the nanowires 7 when the second doped layer is re-grown from the nanowires 7. The gap may be filled with a dielectric material, an intrinsic or a low doped semiconductor material. The material in the gap may be transparent. Due to the separation, each nanowire 7 defines a separate photodiode joined to adjacent nanowire photodiodes by the semiconductor substrate and optionally by a common first contact arranged on the second doped layer.

In particular the photodiodes of FIGS. 2a-b may comprise III-V semiconductor materials on Si, by way of example an n+-Si layer in a semiconductor substrate made of Si, intrinsic InGaAs nanowires, a p-InGaAs low doped region and a p+ InGaAs layer enclosing the low doped region. Such photodiodes can be exposed to light through the n+ Si layer if it is transparent to the incident photons or alternatively they can be exposed to light from the top side through the p+ layer, if selected with a bandgap higher than the underlying layer. Since the light absorption region 11 of the photodiodes illustrated in FIG. 2 is positioned at the nanowire side of the photodiode a multitude of other III-V materials can be used, and hence the bandwidth ranges from long wavelength IR (InSb, 0.17 eV) to high UV (AlN, 6.2 eV). The high flexibility of material choice is due to a fundamentally high tolerance of lattice mismatch that nanowires have been shown to exhibit. Furthermore, recent advances in epitaxial growth of III-V nanowires directly on Si enables the fabrication of high quality III-V material on large, mass production-friendly, Si substrates, decreasing potential fabrication-costs appreciably while avoiding the drawbacks of current wafer bonding solutions.

The photodiodes of the invention may comprise a first contacting means 5 that comprises a top contact electrically connected to the second region. When the photodiode is adapted to receive the light from the nanowire side a transparent top contact is preferred. Examples of suitable transparent contact materials are ITO and ZnO, however not limited to this. Another example of a top contact is a heavily doped semiconductor, which has a wider bandgap and is transparent to incident radiation, terminated with an ohmic contact.

In operation, the above described photodiodes generate a photocurrent due to charge carrier generation in the light absorption region 11. The active region typically is within the low doped region, but may extend into the surrounding p- and/or n-type regions and/or the nanowires. The photo generated charge carriers are inevitably directed to the nanowires 7 and conducted away, due to the reverse bias polarity.

When charge carrier generation is in the substrate part of the p-i-n junction the maximum nanowire spacing should be increased to decrease the dark current. However, the nanowire spacing is limited by increased trapping and recombination, and thus reduced collection efficiency, as the spacing increases. Nanowires 7 protruding from a Si-substrate are preferably spaced apart with a maximum spacing of less than 2 µm, preferably between 0.1 and 1 µm. In general, the maximum spacing may be expressed in terms of the maximum diffusion length of the minority charge carriers. In one embodiment, when the light absorption region is partially undepleted, the nanowires 7 are positioned with a maximum spacing between adjacent nanowires 7 that is less than the minority carrier diffusion length. The nanowires 7 may be arranged in an ordered array with equal spacing between adjacent nanowires, but the nanowires 7 may also be more randomly distributed although having an average spacing not exceeding the preferred intervals.

The photodiodes according to the invention differ from a conventional planar device in that the one lateral layer is split into a large number of columns. Advantage with this splitting is as mentioned above that the nanowire partitioning enables flexibility in selection of materials, bandgaps, doping profiles and/or levels and low defect density, which enables improved leakage current, operating voltage and service life.

A fundamental advantage with nanowire photodiodes of the present invention is that the current path is partitioned without the loss of active volume, leading to a lower dark current without loss of quantum efficiency. The device physics is similar for the radial design and the axial design, with the added benefit for the radial p-i-n structure being that the interface extends along the length of the nanowire and that the crucial carrier separation takes place in the radial direction. The collection distance is expected to be smaller than the minority carrier diffusion length and thus the photo generated carriers can reach the p-i-n junction with very high efficiency without substantial bulk recombination. The partitioning of the photodiode may also decrease the capacitance of the photodiode and thus increases the operation speed.

Both nanowires and nanostructures can be used in the photodiode to take advantage of the partitioning effect. In other words, the nanowire may have different lengths, i.e. it is a nanowie or a nanostub.

Referring to FIG. 3a, the active region of the photodiode may be substantially within the nanowires. In one embodiment of the present invention the photodiode comprises essentially intrinsic or low doped nanowires on a n-doped semiconductor substrate 3. An end portion of the nanowires 7, opposite to the substrate 3, are enclosed in a p-type semiconductor material connected to a first contacting means 5. Consequently the depletion region is formed substantially in the nanowires. The depletion region may comprises the light absorption region and optionally also an avalanche multiplication region. The bandgap of the nanowire may be designed by using heterostructures of different composition and/or doping level.

FIG. 4 schematically illustrates one embodiment of a nanowire-based photodiode comprising a p-i-n junction at least partly formed by a first region 1 made of a semiconductor material having a first conductivity type and a second region 2 made of a semiconductor material having a second conductivity type opposite to the first conductivity type, i.e. the first region is p-type and the second region is n-type or the first region is n-type and the second region is p-type. The p-i-n junction further comprises a low doped region 10 between the first and second region 1,2 in order to form an light absorption region 11. The low doped region 10 is split into a first low doped layer and a second low doped layer by an array of nanowires 7 that are arranged to collect charge carriers generated in a light absorption region 11. Said first region 1 is formed by a first doped layer of the first conductivity type in a semiconductor substrate 3. The first low doped layer made of a low doped or intrinsic semiconductor material of the first conductivity type is provided between the nanowire array and said first region 1, typically as a surface layer arranged on the semiconductor substrate 3. Each nanowire 7 protrudes through openings in a dielectric layer 15, alternatively a low doped or intrinsic semiconductor layer, to the second low doped layer of the second conductivity type. Said second region 2 is at least partly formed by a second doped layer of the second conductivity type arranged on the second low doped layer. In operation charge carriers generated from absorbed light in the second low doped layer are collected by the nanowires 7 and transported to the first low doped layer.

By way of example, in the photodiode structure of FIG. 4, the first doped layer comprises n+ Si, the first low doped layer comprises n− Si, the second low doped layer comprises p− InGaAs, and the second doped layer comprises p+ InGaAs.

FIG. 5 schematically illustrates one embodiment of a nanowire-based APD comprising a p-i-n junction at least partly formed by a first region 1 made of a semiconductor material having a first conductivity type and a second region 2 made of a semiconductor material having a second conductivity type opposite to the first conductivity type, i.e. the first region is p-type and the second region is n-type or the first region is n-type and the second region is p-type. The p-i-n or pn junction further comprises an active region for generation of charge carriers from absorbed light. The p-i-n junction further comprises a low doped region 10 between the first and second region 1,2 in order to form an active region. The low doped region 10 is split into a first low doped layer and a second low doped layer by one or more nanowires 7 that are arranged to collect charge carriers generated in a light absorption region 11 of the active region. Said first region 1 is formed by a first doped layer of the first conductivity type in the semiconductor substrate 3. The first low doped layer made of a low doped or intrinsic semiconductor material of the first conductivity type is provided between each nanowire 7 and said first region 1, typically as a surface layer arranged on the semiconductor substrate 3, in order to form an avalanche multiplication region 12. Each nanowire 7 protrudes through openings in a dielectric layer 15, alternatively a low doped or intrinsic semiconductor layer, to the second low doped layer of the second conductivity type, wherein the second low doped layer form a light absorption region 11. Said second region 2 is at least partly formed by a second doped layer of the second conductivity type arranged on the second low doped layer. In operation, charge carriers generated from absorbed light in the second low doped layer are collected by the nanowires 7 due to a reverse bias and transported to the first low doped layer.

By way of example, in the APD structure of FIG. 5, the first doped layer comprises n+ Si, the first low doped layer comprises p− Si, the second low doped layer comprises p− InGaAs, and the second doped layer comprises p+ InGaAs. Such an APD utilizes the low noise multiplication ability of Si with high efficiency absorption InGaAs material. In operation, photons in the infrared region, to which the Silicon is transparent, typically incident from the substrate side, are absorbed in the p-InGaAs layer. Under reverse bias the photogenerated electrons drift towards the Si-part and are injected into the high-field p-Si multiplication region. A key advantage of this concept is that the high field multiplication region is physically separated from the lower field light absorption region. Without this separation, the dark current would be dramatically higher due to Zener tunnelling in the InGaAs region because of the small bandgap and low electron effective mass. A further advantage of this design is that nanowires that are exposed to high fields are more prone to circuit breaking behavior rather than to short circuit.

Si nanowire APDs are interesting for communication devices due to the low noise (avalanche noise) properties. In standard planar epitaxial growth technology it is not possible to form InGaAs—Si APDs because of the large lattice mismatch. Wafer bonding is currently the only alternative but results have been disappointing due to the large leakage currents.

Figure 6:
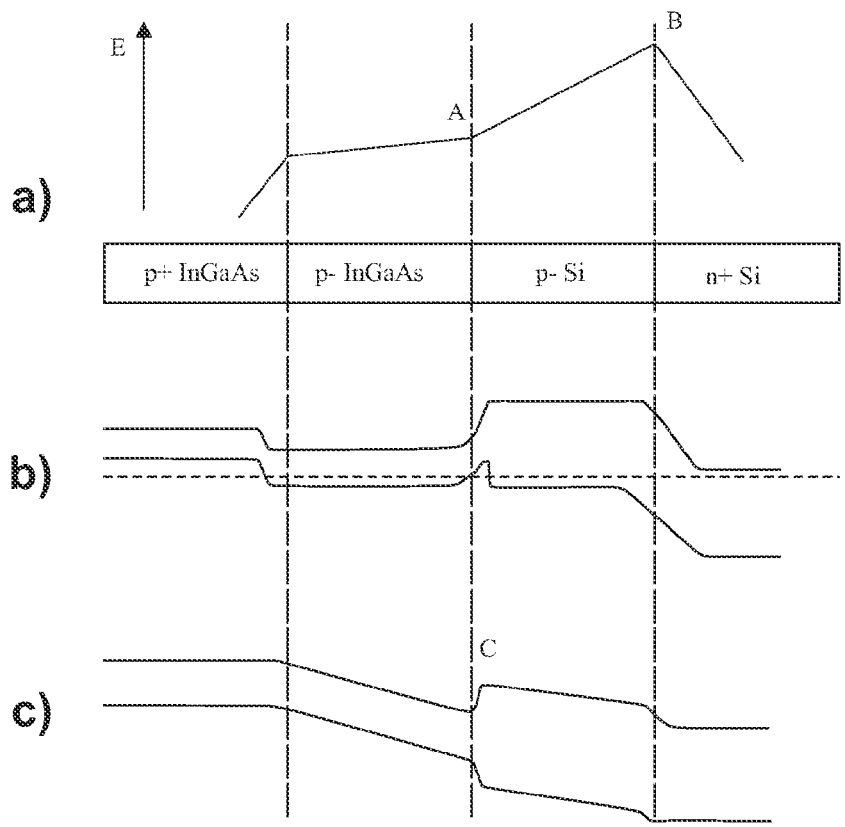
FIG. 6 schematically illustrates (a) an electric field diagram and band diagrams of the InGaAs/Si SAM APD of FIG. 5 (b) with no bias and (c) reverse biased.

FIG. 6 schematically illustrates in a) an electric field diagram for the embodiment of FIG. 5 under reverse bias and the band gap diagrams of this APD in b) without and in c) with bias. Note that the doping of the p-Si can also be either uniform or non uniform with a highly doped p+ spike (not exceeding a few 100 nm in thickness) in an a low doped p region. This so called Hi_LO APD configuration has the advantage of achieving high gain at lower electric fields in the multiplication region because the field is nearly uniform in this region. The avalanche excess noise is also smaller since the ratio of ionization coefficients is higher at lower fields. If an intrinsic or low doped Si layer is used instead of a p− Si layer a doping spike should be introduced just away from the interface to the p-InGaAs layer.

Such avalanche photodiodes can be designed so that:
the peak electric field is high enough to enable avalanche;
the photogeneration takes place in the p− InGaAs region, which may be a radially coalesced layer enclosing the nanowires, and electrons are injected into the p− Si region;
the p− InGaAs region is fully depleted; and
the electric field in the p− Si region at A in FIG. 6 is low enough to prevent tunneling (Ei<1.5×10 exp 5V/cm for an InGaAs composition having about 50% GaAs and 50% InAs).

The latter is critical since if the field is to high the dark current rapidly increases with bias. Further tunneling is less likely with a low gradient at C in FIG. 5

The photodiodes according to the invention is not limited to the polarities shown. A pn configuration may be exchanged for a np configuration. A device with opposite polarities, with n-type wires may be more convenient from a fabrication point of view. In the nanowire APD two or more materials can be used in the nanowire to reduce heterojunction barriers that will lead to carrier pile up effects that could slow down the device. For example a GaInAsP nanowire can be used wherein the Ga and P content is varied along the nanowire. This is particularly important for high speed communication (above ~1 Gb/s).

As mentioned above, the invention makes it possible to provide photodiodes that have improved dark current properties making it possible to make improved large-area devices. It is a further advantage of the invention to provide photodiodes that have a substantially constant dark current over time, thereby significantly reducing the risk for failure due to short circuiting. In particular the improved dark current properties are useful for photodiodes operated at high reverse bias levels, such as APDs, since deterioration of the semiconductor materials is accelerated due to the formation of localized high electric field spots, also known as microplasmas. This can lead to current filamentation, local heating and eventually premature device breakdown. Instead the nanowires of the photodiodes according to the invention may be designed to provide a circuit breaker behavior. This failure mechanism manifests itself as a large increase of the nanowire resistance, usually by several orders of magnitude, following application of a high electric field over the nanowire. The circuit breaker behavior is advantageous over short circuiting behavior since failure of one or a smaller number of nanowires in a large array will not significantly affect the performance while a short circuit may be detrimental. Further, this behavior can be used to further improve the performance and reliability of photodiodes according to the invention by utilizing at least a portion the nanowires as a current limiting structure based on a space charge build-up in the nanowire portion. This space charge effect yields a surprisingly high, and designable, series resistance which makes it possible to prevent excessive current leakage and device failure. Reverse resistance of the photodiode may also be increased to enable photodiodes with higher breakdown voltage and improved avalanche functionality.

The basic nanowire photodiode in accordance with the invention already provides improved current leakage and dark current properties. The performance, and in particular the current leakage and dark current properties, of the nanowire photo diode according to the invention can be further improved by proper design of the photodiode in order to form an ideal spreading of the depletion region into the nanowire. The critical section of the photodiode is in the following referred to as a current limiting structure and the following description and estimation demonstrates that several parameters, such as the dimensions of the nanowire, the doping levels, and semiconductor materials can be varied to obtain desired properties.

In one embodiment of the present invention a photodiode according to the invention comprises a current limiting structure. The current limiting structure comprises at least a portion of each nanowire 7 enclosed in a dielectric material or a low doped or intrinsic material, whereby, in operation, said portion is adapted to be at least partly depleted in order to provide a predetermined space charge effect.

The current limiting effect can be designed by varying a number of parameters such as: the spacing of the nanowires; the doping level; the diameter and the length of the nanowire portion; or by introducing a heterostructure in the nanowire or by changing materials combinations.

The current limiting structure can be designed without significant influence on the active region of the photodiode. Hence a large active region in combination with the current limiting structure can be obtained. In reverse bias mode, an active region of a photodiode is formed substantially in a low doped region adjacent to each nanowire in accordance with the invention. The photodiode comprises a charge limiting structure formed by a portion of the nanowire extending from an interface to the low doped region. Due to the high electrical field the nanowire is at least partly depleted and a space charge is built up. A predetermined current limiting effect can be obtained by control of the properties, and the operation, of the p-i-n junction. Basically the effect is dependent on to which extent the depletion region extends into the nanowires. This can for example be controlled by the doping of the nanowires and the adjacent region. The current limiting structure may be small, while having a large light absorption region.

A rough estimation of the space charge resistance in a nanowire gives:

$$\nabla^2 V = \frac{J}{\varepsilon v_D} \quad (1)$$

$$V = \frac{1}{2} \frac{J}{\varepsilon v_D} l^2 = \frac{1}{2} \frac{I}{A} \frac{l^2}{\varepsilon v_D} \quad (2)$$

$$R_s = \frac{V}{I} = \frac{1}{2} \frac{l^2}{A \varepsilon v_D} = \frac{2}{\pi} \frac{(10^{-4})^2}{(10^{-5})^2 \times 8.85 \times 10^{-14} \times 10^8} \sim 10 \text{ M}\Omega \quad (3)$$

V is the voltage across the wire length l, assumed to be about 1 micron; J and I are the nanowire current density and current. A is the nanowire cross-sectional area (assumed to correspond to a diameter of about 100 nm), $v_D$ is the carrier drift velocity taken to be about $10^7$ cm/s. The permittivity of the semiconductor NW is assumed to be about 10.

The estimation shows that the space charge resistance is very high and this can be used to:
 minimize internal leakage currents, i.e. dark current;
 increase the resistance to levels not readily possible with planar technology:
 establish huge space charge effect in forward biased p-i-n devices;
 prevent local fatal device failure, since space charge does not affect reverse biased devices unless there is surge (rapid current rise near the breakdown voltage);
 design I-V-characteristics; etc.

Different implementations of a nanowire photodiode according to the invention can be envisaged in:
 communication;
 large area, low ID, devices on Si; in particular long wavelength devices
 mid-IR devices, in particular cameras; and
 radiation hardened devices, in particular using nanowires comprising nitride semiconductors such as GaN.

Referring to FIG. 7, a well known problem in planar technology is that a doping profile is created that yields locally higher electric fields at the device perimeter, resulting in premature breakdown. To avoid this, a guard ring is used in planar avalanche photodiodes. The nanowire approach eliminates the need for the guard ring since a hemispherical doping profile in the substrate in connection with each nanowire yields a homogenous electric field at the same distance from the nanowire. FIG. 7 schematically illustrates an array of nanowires protruding from a substrate and having a hemispherical doping profile under each nanowire. This hemispherical doping profile can be realized in many ways, for example by dopant diffusion during nanowire growth, or dopant implantation or diffusion previous to nanowire growth. An alternative configuration is to have a doping profile extending between the bases of the nanowires, as to give a homogeneous planar doping under the nanowires to avoid the guard ring. This adds one fabrication step, before growth or in situ before nanowire growth. Both nanowires and nanostubs can be used to eliminate the guard-ring but in order to obtain circuit breaker behavior, nanowires should be used.

The present invention enables heterojunction PDs wherein practically "any" semiconductor materials can be combined. This is possible because nanowires can be grown on semiconductor substrates or layers regardless of the lattice mismatch. Materials that can be used can range from, at least InSb (0.17 eV) to AlN (6.2 eV), allowing photocurrent response from the far infra-red into the ultra-violet. In general the material of the absorbing regions is the same of that of the nanowire or nanostub although if the absorbing material has small bandgap it will be helpful to have the nanowire of higher bandgap to further reduce the dark current with a graded interface with the absorbing layer to allow good carrier collection through the nanowires.

Although the embodiments have been described with InGaAs/Si structures as an example, other III-V materials can be used, such as for example InAsP and any different combinations of In, Ga, As, and P, and other semiconductor substrates may be used. As appreciated by a person skilled in the art, the stochiometric composition of the compounds can be varied. Suitable materials for doping are well known in the art.

A semiconductor material without significant dopant species present is commonly referred to as an intrinsic semiconductor material, which is designated as i in the p-i-n junction. For the purpose of this application it is to be appreciated that an intrinsic region or material also can be a region with carrier concentration substantially comparable to or equal to the intrinsic value, unintentionally doped or low doped p-type or n-type.

The different regions in a photodetector may consist of several layers of different composition or even layers with compositional grading or having a graded doping profile. While, the embodiments in this application are described without such heterojunctions it is intended to be within the scope of the application. By way of example only, a pn or p-i-n junction may be obtained by having the core-shell structure described above and using a heterostructure segment in the nanowires instead of a doped semiconductor substrate. Furthermore, the devices can generally be designed to work in avalanche mode although this is not explicitly disclosed in the description.

Surface layer is used throughout this application to denote a semiconductor layer arranged on a semiconductor substrate. Such layers are commonly referred to as buffer layers, which often provide one-dimensional properties due to limited thickness of the layer. Surface layers according to the invention are neither limited in thickness nor to one-dimensional properties. On the contrary, the surface layer may have bulk-like properties.

Although the present invention have been described in terms of "top", "vertical", "back", and the like, the physical orientation in space of the photodetector device is not of importance. These terms are only used to describe the interrelations between different features of the photodetector.

While the invention has been described in connection with what is presently considered to be the most practical and preferred embodiments, it is to be understood that the invention is not to be limited to the disclosed embodiments, on the contrary, it is intended to cover various modifications and equivalent arrangements within the appended claims.

The invention claimed is:

1. A photodiode comprising a p-i-n or pn junction at least partly formed by
   a first region comprising a semiconductor material having a first conductivity type and
   a second region comprising a semiconductor material having a second conductivity type opposite to the first conductivity type,
wherein the p-i-n or pn junction comprises a light absorption region for generation of charge carriers from absorbed light, and
wherein one section of the p-i-n or pn junction comprises an array of nanowires that are spaced apart and arranged to transfer said charge carriers from the light absorption region.

2. The photodiode according to claim 1, wherein:
   the p-i-n or pn junction comprises at least a first low doped region comprising a low doped or intrinsic semiconductor material provided between the nanowires and one of said first region and said second region, and
   the light absorption region is substantially within said first low doped region.

3. The photodiode according to claim 2, wherein the p-i-n or pn junction further comprises an avalanche multiplication region for multiplication of charge carriers generated in the light absorption region.

4. The photodiode according to claim 2, wherein the avalanche multiplication region and the light absorption region substantially are within the first low doped region.

5. The photodiode according to claim 1, comprising:
   a first low doped region made of a low doped or intrinsic semiconductor material provided between the nanowires and said first region and
   a second low doped region made of a low doped or intrinsic semiconductor material provided between the nanowires and said second region,
wherein the second low doped region is arranged to contribute to the formation of a light absorption region for generation of charge carriers and the first low doped region is arranged to contribute to the formation of an avalanche multiplication region.

6. The photodiode according to claim 1, wherein:
   the nanowires protrude from a semiconductor substrate or a surface layer arranged on the semiconductor substrate; and
   the semiconductor substrate or the surface layer comprises said first region.

7. The photodiode according to claim 6, wherein:
   said first region of first conductivity type is a doped region in the semiconductor substrate or the surface layer; and
   the first low doped region is provided between said first region and the nanowires.

8. The photodiode according to claim 3, wherein:
   said second region of second conductivity type is at least partly formed by the array of nanowires;
   said first region is at least partly formed by a first doped layer of the first conductivity type in the semiconductor substrate; and
   a first low doped layer made of a low doped or intrinsic semiconductor material of the first conductivity type is provided between the array of nanowires and said first region in order to at least partly form said first low doped region.

9. The photodiode according to claim 2, wherein:
   said first region is formed by a first doped layer of the first conductivity type in the semiconductor substrate;
   a first low doped layer made of a low doped or intrinsic semiconductor material is provided between the nanowires and said first region;
   the nanowires protrude through openings in a dielectric layer or a low doped or intrinsic semiconductor layer to a second low doped layer of the second conductivity type, wherein the second low doped layer form the light absorption region; and
   said second region is at least partly formed by a second doped layer of the second conductivity type arranged on the second low doped layer;
whereby charge carriers generated from absorbed light in the second low doped layer are collected by the nanowires and transported to the first low doped layer.

10. The photodiode according to claim 9, wherein:
    the first doped layer comprises n+ Si;
    the first low doped layer comprises n− Si;
    the second low doped layer comprises p− InGaAs; and
    the second doped layer comprises p+ InGaAs.

11. The photodiode according to claim 9, wherein:
    the first doped layer comprises n+ Si;
    the first low doped layer comprises p− Si;
    the second low doped layer comprises p− InGaAs, and the second doped layer comprises p+ InGaAs; and
    the first doped layer is adapted to form the avalanche multiplication region.

12. The photodiode according to claim 1, wherein at least a portion of each nanowire is enclosed by a shell layer comprising the low doped region overgrown by a second doped layer, the second doped layer at least partly forming said second region of the p-i-n junction.

13. The photodiode according to claim 1, further comprising a current limiting structure, wherein the current limiting structure comprises at least a portion of each nanowire enclosed in a dielectric material, an insulating material or a low doped or intrinsic material, whereby, in operation, said portion is adapted to be at least partly depleted in order to provide a predetermined space charge effect.

14. The photodiode according to claim 13, wherein the nanowire portion of the current limiting structure is doped.

15. The photodiode according to claim 1, wherein the nanowire comprises a low doped or intrinsic semiconductor material.

16. The photodiode according to claim 1, wherein the nanowire comprises III-V semiconductor material.

17. The photodiode according to claim 1, wherein the light absorption region comprises one or more of the semiconductor materials selected from the group of InGaAs, InAsP and InGaAsP.

18. The photodiode according to claim 6, wherein the semiconductor substrate comprises Si.

19. The photodiode according to claim 1, further comprising a transparent contact electrically connected to one of said first region and said second region.

20. The photodiode according to claim 1, wherein the nanowires are arranged to provide an avalanche multiplication region.

21. The photodiode according to claim 6, wherein the semiconductor substrate or the surface layer comprises a hemispherical doping profile in connection with each nanowire.

* * * * *